(12) United States Patent
Abe et al.

(10) Patent No.: US 7,576,540 B2
(45) Date of Patent: Aug. 18, 2009

(54) GRADIENT COIL AND MAGNETIC RESONANCE IMAGING APPARATUS USING THE SAME

(75) Inventors: Mitsushi Abe, Hitachinaka (JP);
Yukinobu Imamura, Hitachi (JP);
Takeshi Yatsuo, Kashiwa (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 11/844,519

(22) Filed: Aug. 24, 2007

(65) Prior Publication Data

US 2008/0074112 A1 Mar. 27, 2008

(30) Foreign Application Priority Data

Sep. 26, 2006 (JP) ............................. 2006-259868

(51) Int. Cl.
*G01V 3/00* (2006.01)
(52) U.S. Cl. ....................................... 324/318
(58) Field of Classification Search .................. 324/318
See application file for complete search history.

(56) References Cited

U.S. PATENT DOCUMENTS

| | | | |
|---|---|---|---|
| 5,198,769 A | 3/1993 | Frese et al. | |
| 5,349,318 A | 9/1994 | Inoue | |
| 5,512,828 A | 4/1996 | Pausch et al. | |
| 5,561,371 A | 10/1996 | Schenck | |
| 5,581,187 A | 12/1996 | Pausch | |
| 6,154,110 A | 11/2000 | Takeshima | |
| 7,026,815 B2 | 4/2006 | Harvey et al. | |
| 2004/0251901 A1 | 12/2004 | Tsuda et al. | |
| 2006/0033496 A1 | 2/2006 | Shvartsman et al. | |

FOREIGN PATENT DOCUMENTS

| | | |
|---|---|---|
| EP | 0919825 | 6/1999 |
| EP | 1408339 | 4/2004 |
| WO | 02/27346 | 4/2002 |

OTHER PUBLICATIONS

Shvartsman et al, "Gradient Coil Design with 3D Geometry and Variable Field-of-View", ISMRM Scientific Meeting & Exhibition, Jul. 10, 2003, p. 743.
"Design of Planar Self-shielded Gradient Coil" by Takeuchi, et al, The Institute of Electrical Engineers of Japan, 1998, vol. 118, No. 3, pp. 287-292.

*Primary Examiner*—Brij B. Shrivastavg'
*Assistant Examiner*—Megann E Vaughn
(74) *Attorney, Agent, or Firm*—Mattingly & Malur, P.C.

(57) ABSTRACT

The gradient coil for a magnetic resonance imaging apparatus is adapted to encode information on a spatial position of a subject to be inspected into a nuclear magnetic resonance signal. The gradient coil includes a primary gradient coil and a shielded gradient coil. The primary gradient coil generates a gradient magnetic field in the imaging area. The shielded gradient coil is located on the side opposite to the imaging area relative to the primary gradient coil and cancels the gradient magnetic field generated by the primary magnetic field. The shielded gradient coil has a first area including a central axis perpendicularly extending through the central portion of the imaging area and a second area located on the side of the outer circumference of the first area. The second area is more inclined toward the imaging area than the first area.

14 Claims, 8 Drawing Sheets

GRADIENT COIL AND MAGNETIC RESONANCE IMAGING APPARATUS USING THE SAME

BACKGROUND OF THE INVENTION

1. Field of the Invention

The present invention relates to a gradient coil for a magnetic resonance imaging apparatus. In particular, the present invention relates to a gradient coil for a magnetic resonance imaging apparatus, which is capable of suppressing magnetic interactions with peripheral structures, and to a magnetic resonance imaging apparatus using the gradient coil.

2. Description of the Related Art

In a diagnosis using a nuclear magnetic resonance, the intensity of a magnetic field is associated with an area to be diagnosed. It is demanded that the intensity of a magnetic field generated by a magnet system vary within a range of about one millionth of the intensity of the magnetic field. Magnetic fields generated by the magnetic resonance imaging apparatus (hereinafter referred to as an MRI apparatus) are mainly divided into the following three types.

(1) Static magnetic field which is constant in terms of time and space. The intensity of the static magnetic field is typically 0.1 to several Tesla or more. The static magnetic field varies by several ppm in a space (in general, space of a sphere having a diameter of 30 to 40 cm or elliptic shape, hereinafter referred to as an imaging area) in which imaging is performed.

(2) Gradient magnetic field that varies at a time constant of one second or less and is spatially inclined.

(3) Magnetic field generated by an electromagnetic wave with a high frequency (several MHz or higher) for a nuclear magnetic resonance.

The static magnetic field described in (1), which is constant in terms of time and space, is typically generated by a permanent magnet or coil conducting a current. Magnetizing a magnetic body arranged at an appropriate place makes the static magnetic field more uniform.

The gradient magnetic field described in (2) varies in terms of time in the order of several Hz to 100 kHz. The gradient magnetic field is generated by a coil (hereinafter referred to as a gradient coil) in which a current varying in terms of time flows. By adding the gradient magnetic field, the frequency and the position of a nuclear magnetic resonance which is added in the type (3) are associated with each other. In addition, it is necessary that a magnetic field that is three-dimensionally inclined be provided for the gradient magnetic field. For the three dimensions, three types of combinations of coils are used.

Figure 2:
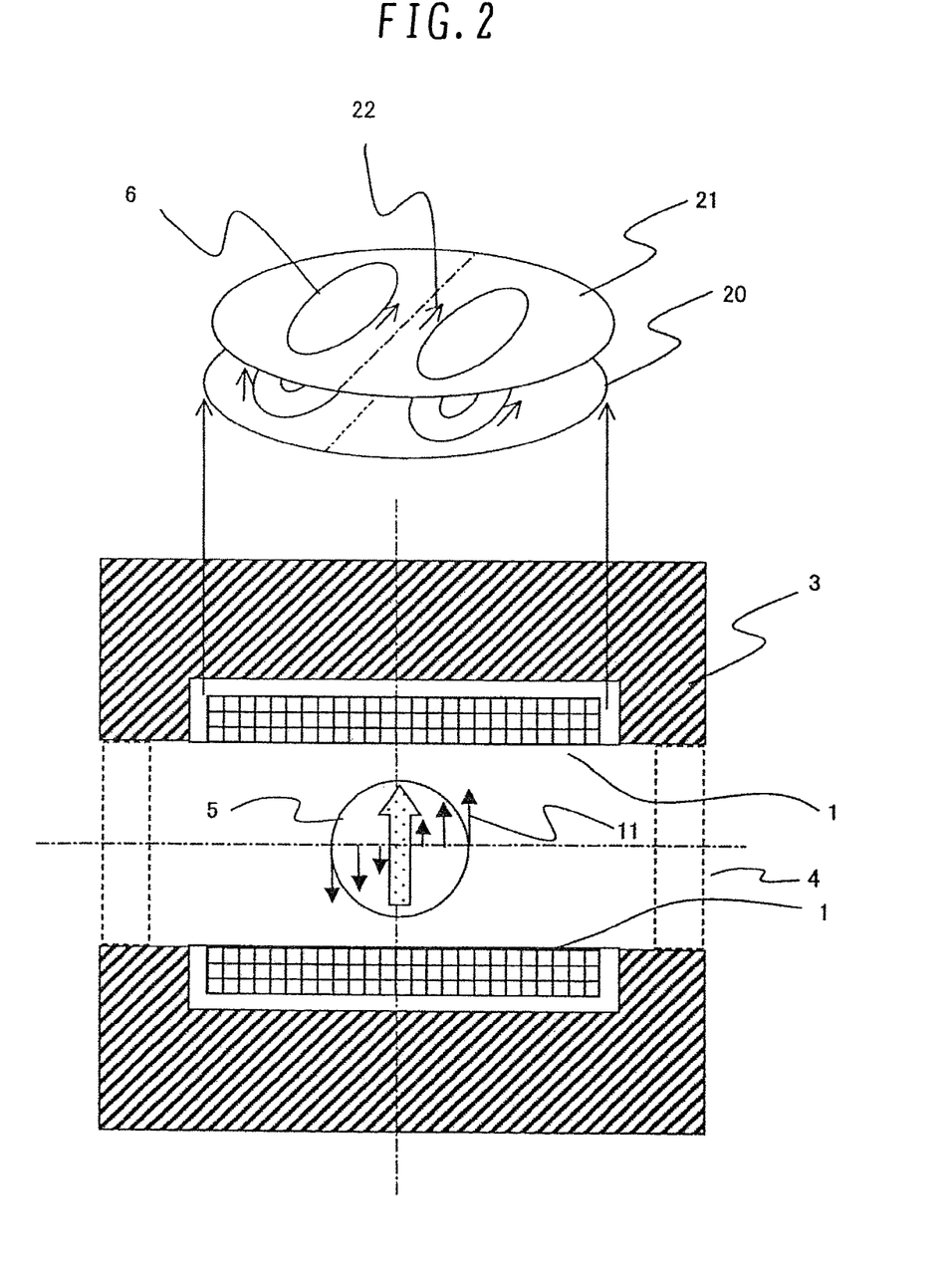
FIG. 2 is a diagram showing an arrangement including conventional magnetic pole pieces and an apparatus, which generate a magnetic field.

FIG. 2 is a diagram showing the arrangement including magnetic pole pieces generating the abovementioned conventional magnetic fields and an apparatus which is a vertical magnetic field type MRI apparatus with an open type static magnetic field magnet. In FIG. 2, reference numeral 1 denotes a gradient coil; 3, a magnetic pole piece; 4, a connecting pole; 5, imaging area; and 11, a gradient magnetic field. The upper and lower magnetic pole pieces 3 are supported by the connecting poles 4. The lower diagram of FIG. 2 is a cross sectional view showing the MRI apparatus including the central axis thereof. The imaging area 5 is present between the magnetic pole pieces 3. The upper and lower magnetic pole pieces 3 each have a recessed portion on the side of the imaging area 5. The gradient coil 1 is arranged in each of the recessed portions. A static magnetic field 10 having a high intensity is generated in a direction of a large arrow shaded with dots by coils or permanent magnets. The coils or permanent magnets are arranged in the two magnetic pole pieces 3, which are means for forming a static magnetic field. The static magnetic field is in the order of 0.1 to 10 Tesla.

Upward and downward solid line arrows indicate magnetic lines of force of the gradient magnetic field 11. The upward and downward arrows drawn from an intermediate surface between the upper and lower magnetic pole pieces 3 schematically indicate the direction and size of the gradient magnetic field 11. The farther the gradient magnetic field 11 is from each of the original points of the magnetic lines of force, the higher the intensity of the gradient magnetic field 11 is. The sign of the gradient magnetic field on the upper side of the imaging area 5 is different from the sign of the gradient magnetic field on the lower side thereof. A central axis vertically extending through the center of the imaging area 5 is taken as Z axis. X axis and Y axis are located on a horizontal plane perpendicular to Z axis. The arrows indicate a distribution of the gradient magnetic field generated by an X axis gradient magnetic field coil, which varies in intensity in the X axis direction (or generated by a Y axis gradient magnetic field coil, which varies in intensity in the Y axis direction). The X axis gradient magnetic field coil (or the Y axis gradient magnetic field coil) is the gradient coil 1. The gradient magnetic field varies in intensity and direction depending on the location. The gradient magnetic field has an intensity of about ±100 Gauss and varies in pulse from the order of 0.1 milliseconds to the order of 1 second.

Figure 4:
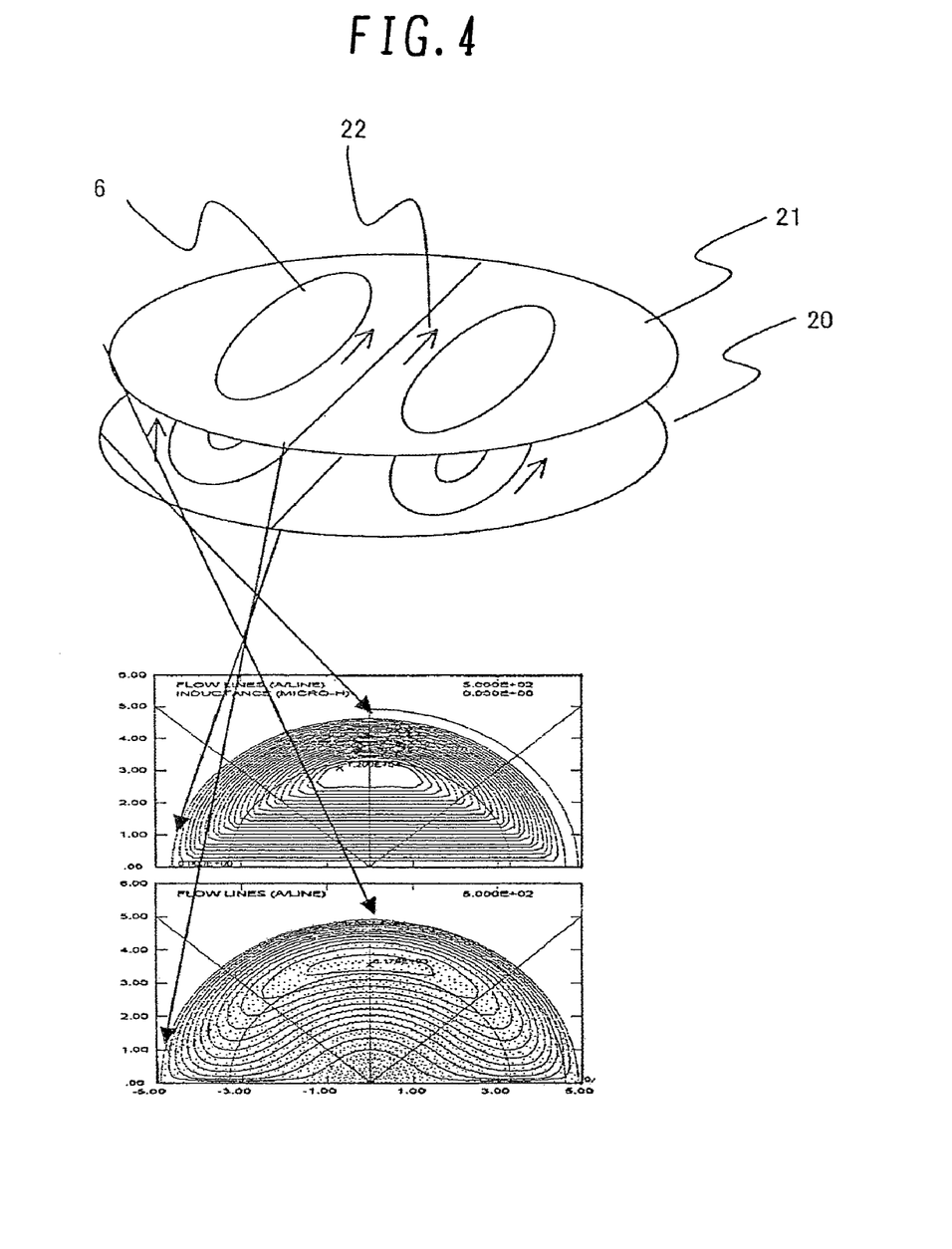
FIG. 4 is a diagram showing a coil pattern of an X axis gradient magnetic field coil that generates a magnetic field with an intensity showing an inclination in a direction parallel to the surface of a gradient coil.

FIG. 4 is a diagram showing a coil pattern of the X axis gradient magnetic field coil (or the Y axis gradient magnetic field coil) that generates a magnetic field. The magnetic field has an intensity showing an inclination in a direction parallel to the surface of the gradient coil. Conductive windings 6 corresponding to a current pattern of each of the coils form a spiral pattern having a single central point (Toshie Takeuchi, et al., "Design of Flat Type Self Shielded gradient coil", The Institute of Electrical Engineers of Japan, 1998, Vol. 118, No. 3, pp. 287-292). In FIG. 4, a crossover 7 between winding loops is not shown (also not shown in the other drawings). The coil present on the side of the imaging area 5 is a primary gradient coil 20. The coil positioned on the side opposite to the imaging area 5 is a shielded gradient coil 21.

Figure 3:
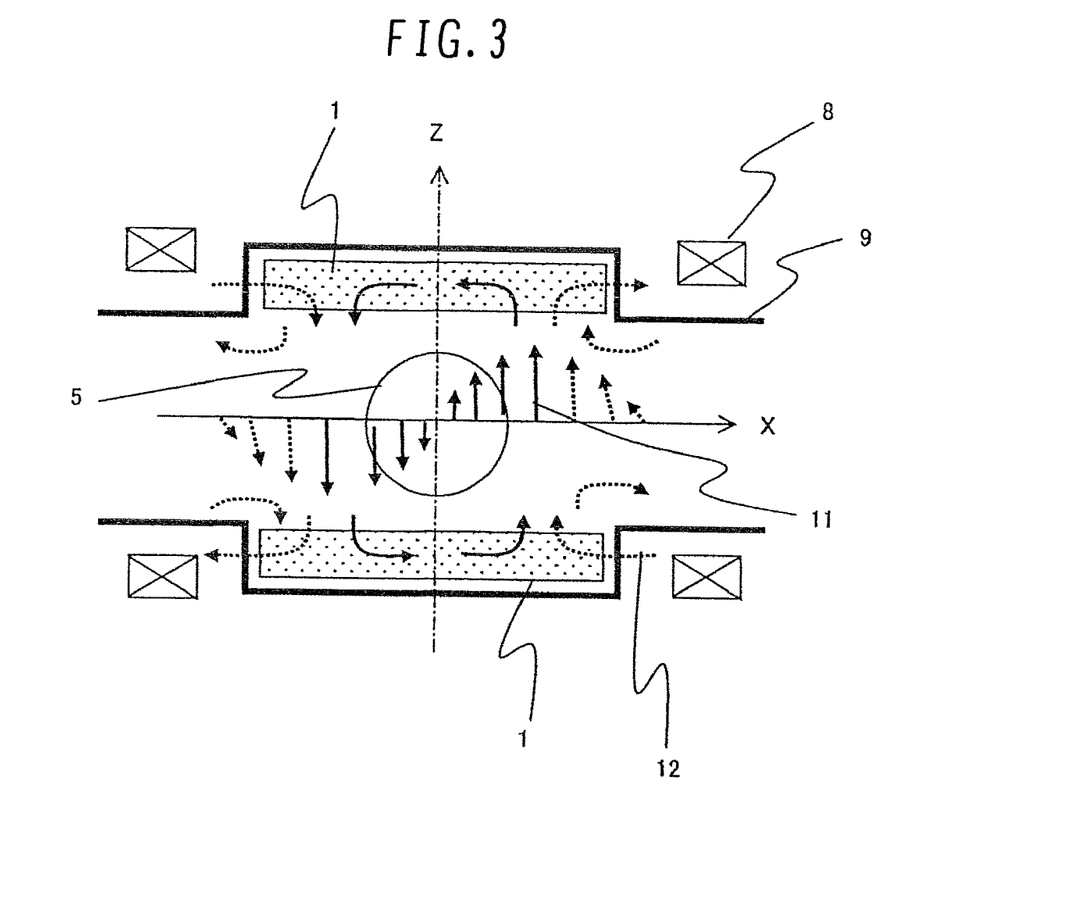
FIG. 3 is a schematic diagram showing magnetic lines of force generated by gradient coils provided in the arrangement including the magnetic pole pieces and the apparatus shown in FIG. 2.

FIG. 3 is a schematic diagram showing magnetic lines of force generated by the gradient coils. The gradient coils are provided in the arrangement including the magnetic pole pieces 3 and the apparatus as shown in FIG. 2. The magnetic lines of force shown in FIG. 3 are present at the recessed portion of the magnetic pole pieces 3. The arrows indicated with solid lines and the arrows indicated with dotted lines indicate the magnetic lines of force of the magnetic field generated by the gradient coils. In FIG. 3, superconductive coils 8 are also shown. Each of the superconductive coils 8 generates a static magnetic field in the imaging area 5 and is arranged annularly around Z axis. The arrows drawn from an intermediate surface between the upper and lower magnetic pole pieces 3 qualitatively indicate the directions and sizes of the magnetic fields generated by the gradient coils. The arrows passing through the gradient coils each indicate the flows of the magnetic lines of force.

The gradient magnetic field 11 indicated by the solid lines passes through the imaging area 5 and the periphery thereof and moves in the gradient coils. After that, the gradient magnetic field 11 returns to the position which is on the side opposite to the position represented by the original coordinates in the imaging area 5. In this case, the gradient magnetic field 11 is oppositely directed. The gradient magnetic lines of force return within the gradient coils in such a manner as to prevent the magnetic field in a shielded gradient coil from leaking to the sides of the magnetic pole pieces 3. On the other hand, the magnetic lines of force (indicated by dotted lines) of a leak magnetic field 12, which are generated by the gradient coil, pass through areas that are away from the imaging area 5. After that, a part of the magnetic lines of force passes through the inside of the magnetic pole pieces 3.

FIG. 4 is a diagram showing conventional gradient coils. For the conventional gradient coils, a current flows in an area of each surface of the coils in a direction opposite to a current flowing at the central area, the area of each surface of the coils having a large diameter and being far from the imaging area 5. In this coil system, although a magnetic field is not generated in a shielded gradient coil on the side opposite to a primary gradient coil, a magnetic field leaks to the outside of the coil system. Such a magnetic field is indicated by the dotted arrows as the magnetic field 12 shown in FIG. 3.

In such gradient coils, when a conductive structural member such as a magnetic polar surface 9 is present in an area having a large diameter, an eddy current is generated on the magnetic polar surface 9. A magnetic field caused by the eddy current disturbs the gradient magnetic field 11 in terms of time and space. This makes it difficult to obtain a clear image through magnetic resonance imaging.

A magnetomotive force source such as the superconductive coil 8 is present in the magnetic pole pieces 3. If the gradient magnetic field leaks into those areas and interferes with the magnetomotive force source, a vibration of an internal structural member such as a coil vibration may occur. As a result, the magnetic field may be oscillated. This makes it difficult to obtain a clear image through magnetic resonance imaging.

The gradient coils are required to generate a desirably accurate gradient magnetic field and have the following:

a property to provide a high intensity per unit of electric current (high efficiency);

a high response property (low inductance);

a property to suppress the generation of an eddy current and to reduce a dynamic error magnetic field, and a small interaction with a magnet that generates a static magnetic field or a structural member of the magnet due to an electromagnetic force.

The above properties can be realized by reducing a magnetic field that is generated in an area other than a necessary area to a minimum possible extent. Specifically, if a magnetic field is generated in an unnecessary area, magnetic energy is required in the unnecessary area, resulting in an increase in inductance. In addition, if a structural member is present in the unnecessary area, an eddy current may be generated, or an electromagnetic interaction may occur. Furthermore, the intensity of a necessary magnetic field is relatively reduced, resulting in a reduction in efficiency. Therefore, when an unnecessary magnetic field present in an area other than the imaging area 5 is reduced, the abovementioned properties can be improved.

SUMMARY OF THE INVENTION

An object of the present invention is to provide a gradient coil that is used for a magnetic resonance imaging apparatus and capable of reducing an unnecessary magnetic field that is generated in an area other than an imaging area, and to provide a magnetic resonance imaging apparatus using the gradient coil.

The gradient coil for the magnetic resonance imaging apparatus is adapted to encode information on the spatial position of a subject into a magnetic resonance signal. The gradient coil includes a primary gradient coil and a shielded gradient coil. The primary gradient coil generates a gradient magnetic field in the imaging area. The shielded gradient coil is positioned on the side opposite to the side of the imaging area relative to the primary gradient coil. The shielded gradient coil is adapted to cancel the magnetic field generated by the primary gradient coil. In addition, the shielded gradient coil has a first area including a central axis perpendicularly extending through the central portion of the imaging area and a second area located on the side of the outer circumference of the first area. The second area is more inclined to the imaging area than the first area.

The present invention provides a gradient coil that is used for a magnetic resonance imaging apparatus and capable of reducing the generation of an unnecessary magnetic field in an area other than an imaging area and provides a magnetic resonance imaging apparatus using the gradient coil.

DETAILED DESCRIPTION OF PREFERRED EMBODIMENTS

As described above, FIG. 3 is a schematic diagram showing magnetic lines of force generated by gradient coils. A gradient magnetic field 11 indicated by solid line arrows passes through an imaging area 5 or the periphery thereof. A magnetic field having magnetic lines of force that pass through the insides of the gradient coils is generated with magnetic lines of force flowing in the vicinity of the center of the primary gradient coil in a positive direction. However, a magnetic field having magnetic lines of force indicated by the dotted lines is generated to be a leak magnetic field 12. A magnetic field which causes an imaging problem is the one generated by a current flowing in the periphery of the primary gradient coil in a direction opposite to a current generating the leak magnetic field 12. In the gradient coil according to the present invention, measures are taken against the magnetic field generated by the current flowing in the periphery of the primary gradient coil. The following two types of the measures (methods) can be proposed.

(1) Reduce the current flowing in the periphery of the gradient coil in the opposite direction.

(2) Direct the magnetic field leaking to the outer periphery of the gradient coil to the direction where a structural member is not present.

Figure 5A:
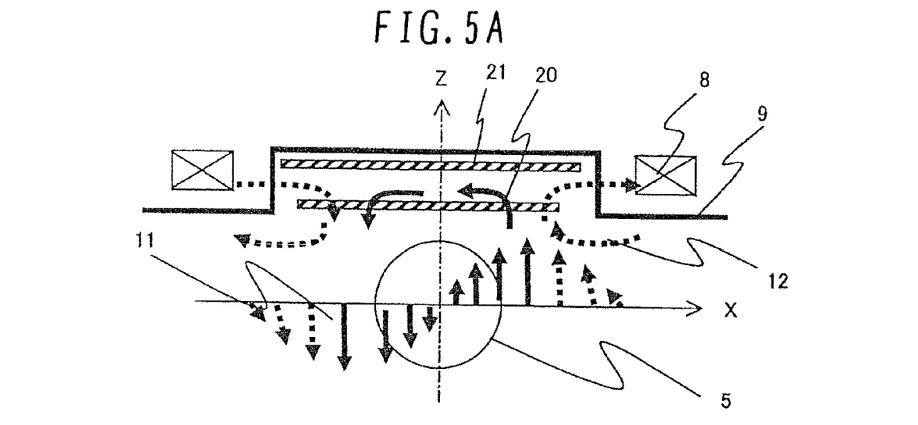
FIGS. 5A to 5C are schematic diagrams each showing a magnetic field generated by the gradient coil according to the present invention.
Figure 5B:
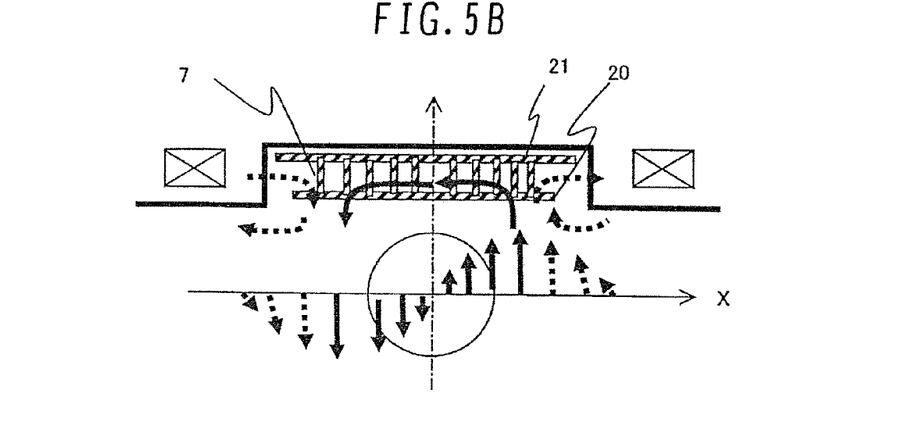
Figure 5C:
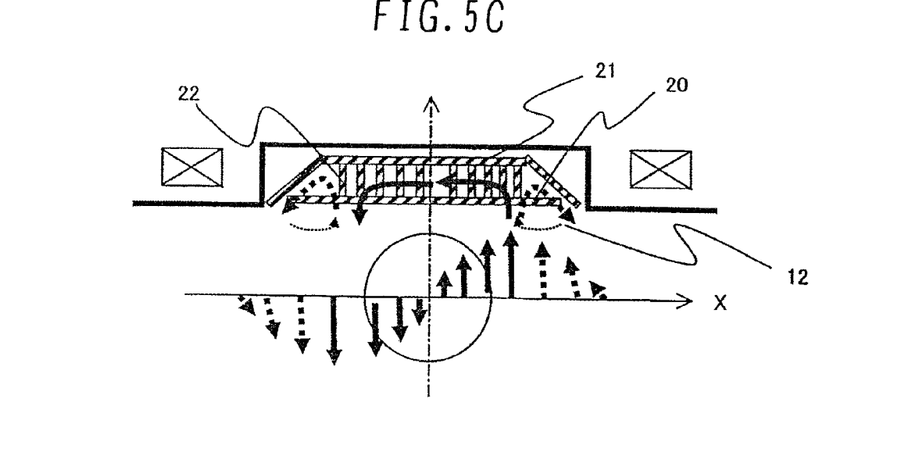

FIGS. 5A to 5C are schematic diagrams each showing a magnetic field generated by the gradient coils according to the present invention, the gradient coils being adapted to perform the above methods. The gradient coil 1 includes a primary gradient coil 20 and a shielded gradient coil 21. Similarly to FIG. 3, the gradient coils 1 (including the primary gradient coil 20 and the shielded gradient coil 21) are arranged in recessed portions of magnetic pole pieces, the recessed portions being placed on the side of the imaging area 5. A superconductive coil 8, which is means for forming a static magnetic field, is arranged in the magnetic pole piece. It should be noted that although a structure on the upper side of X-Y plane is shown in each diagram of FIGS. 5A to 5C, a structure on the lower side thereof is similar to that on the upper side.

FIG. 5A shows the conventional gradient coils 1 and a magnetic field generated by the gradient coils 1. A magnetic field leaking to the outer periphery of the gradient coil has a magnetic flux whose size is similar to that of a magnetic flux passing through an imaging space. For the sizes of the magnetic fluxes, arrows indicating the magnetic lines of force have the same width as shown in FIGS. 5A to 5C.

A connection 7 is provided between the shielded gradient coil 21 and the primary gradient coil 20 to support the method (1) described above. FIG. 5B schematically shows the gradient coils 1 and the magnetic lines of force in the case where the method (1) is used (in the case where the connection is provided between the shielded gradient coil 21 and the primary gradient coil 20). A current flowing at the periphery of the primary gradient coil in an opposite direction (to a positive direction) corresponds to a rewinding for a current flowing in the central portion of the primary gradient coil in the positive direction. On the other hand, in the shielded gradient coil 21, it can be considered that a rewinding of the primary gradient coil 20 is independently present with a current flowing in a direction that causes the magnetic field generated by the primary gradient coil 20 to be canceled. The rewinding of the primary gradient coil 20 is associated with a current flowing in the positive direction, and the rewinding of the shielded gradient coil 21 is associated with a current flowing in the negative direction, resulting in the connection 7. This makes it possible to decrease a current that returns at the outer circumference of the primary gradient coil 20 and flows in the opposite direction. Therefore, the intensity of a leak magnetic field (indicated by the dotted lines shown in FIG. 3) generated by the gradient coil 1 can be reduced.

On the other hand, with the connection provided between the primary gradient coil 20 and the shielded gradient coil 21, the gradient coil 1 has a solenoid coil structure. The return magnetic lines of force flowing in the solenoid coil are present at the entire circumference of the gradient coil 1. Thus, although measures are taken against a magnetic field leaking into the magnetic pole pieces 3 by using the shielded gradient coil 21, a magnetic field leaks to the outside of the gradient coil 1. As a result, a magnetic field that returns at the magnetic pole pieces 3 is generated. The generated magnetic field causes a magnetic interference with the structural member (surfaces 9 of the magnetic pole pieces), resulting in unevenness in an image taken by magnetic resonance imaging.

For the outer circumference of the gradient coil 1, in order to reduce a leak magnetic field causing a magnetic interference with a structure, the method (2) described above can be used. The method (2) prevents magnetic lines of force of the magnetic field 12 leaking to the outer periphery of the gradient coil 1 from being directed to the structural member. FIG. 5C schematically shows the gradient coil 1 and the magnetic lines of force generated by the gradient coil 1 in the case where the methods (1) and (2) are used. In the method (2), the outer circumference of the shielded gradient coil 21 is bent close to the primary gradient coil 20.

The shielded gradient coil 21 has a first area including a central axis vertically extending through the central region of the imaging area 5 and a second area located on the side of the outer circumference of the first area. The second area is bent to the side of the imaging area at an angle larger than the first area. In other words, the second area is more inclined to the imaging area than the first area. In addition, the gradient coil is configured into a truncated cone shape, in which the primary gradient coil forms the bottom portion of the truncated cone shape while the shielded gradient coil forms the side portion and top portion thereof (i.e., portions other than the bottom portion).

Since the outer circumference portion of the shielded gradient coil 21 is bent in the abovementioned manner so that it is placed closely to the primary gradient coil 20, the magnetic lines of force are directed to not the side of the structural member but an area between the magnetic pole pieces as shown in FIG. 5C. This makes it possible to reduce an adverse effect on the imaging.

A current generating a leak magnetic field, which causes a problem, is the one flowing in the outer circumference of the primary gradient coil 20 in the opposite direction to that flowing at the central area of the primary gradient coil 20. In order to shield a leak magnetic field generated by a current flowing in the outer circumference of the primary gradient coil, it is necessary to increase a current flowing in the direction opposite to that in the central area of the shielded gradient coil (in the same direction as that in the central area of the primary gradient coil). The shielded gradient coil according to the present invention has a plurality of annular conductors that are spirally arranged, and return portions (in which a current flows in a direction opposite to that in the central area of the shielded gradient coil 21) of the annular conductors are present more in the second area than in the first area as much as possible. Since most of return portions (in which a current flows) of the conductors in the shielded gradient coil pass through the second area, a leak magnetic field is more efficiently suppressed. Such an arrangement can be achieved, for example, by placing the central points of spiral patterns of the annular conductors on the side (outer circumference side) of the second area.

It is preferable that the return portions of the conductors be placed more in the second area than in the first area as much as possible. Based on the result of the study performed by the inventors, it has been confirmed that a leak magnetic field is remarkably shielded by placing the conductors each having a return portion more in the second area than in the first area (by placing a half or more of the return portions of the conductors in the second area). More preferably, the shielded gradient coil is arranged so that the conductors each having a return portion are placed more on the side of the outer circumference of the second area than on the side of the inner circumference thereof. In addition, the shielded gradient coil is preferably arranged so that the number of the conductors each having a return portion increases as the distance from the center of the shielded gradient coil increases. Placing the return portions of the annular conductors that are spirally arranged on the outer circumference side of the shielded gradient coil makes it possible to reduce an unnecessary magnetic field generated in an area other than the imaging area.

The Y axis gradient magnetic field and the Z axis gradient magnetic field can be described similarly to the case of the X axis gradient magnetic field. In the case of the Z axis gradient magnetic field, however, since a winding is not basically present on a primary gradient coil, only the method (2) can be used.

As a structure capable of achieving the methods (1) and (2), the following structures (1) and (2) can be used.

(1) Connections are provided between a part of turns of the shielded gradient coil 21 and a part of turns of the primary gradient coil 20 to reduce the number of the turns on the outer side of the spiral pattern and to reduce magnetic lines of force that flow to the structural member (magnetic pole piece surface 9).

The connection 7 between the primary gradient coil 20 and the shielded gradient coil 21 serves to reduce the turns of the winding placed on the outer side of the spiral pattern. A current flowing in the turns of the winding generates a magnetic field that is directed to the outer side of the spiral pattern. Thus, a reduction in the number of the turns reduces the intensity of a magnetic field that is directed to the outer side of the spiral pattern.

(2) The shielded gradient coil 21 is formed into an umbrella-like shape, not into a flat shape, so that the vertical position of the outer portion of the shielded gradient coil 21 is close to the vertical position of the primary gradient coil 20.

Forming the shielded gradient coil 21 into an umbrella-like shape reduces the intensity of a magnetic field that is directed to the outer side of the spiral pattern as apparent from the comparisons with reference to FIGS. 5A to 5C. By changing the shape of the shielded gradient coil 21, the magnetic lines of force on the outer side of the spiral pattern is directed to the side of a magnetic equatorial plane.

A change in the shape of the shielded gradient coil 21 provides an effect of shielding a magnetic field generated by the primary gradient coil 20 even for the magnetic pole piece surface 9 which is placed at the recessed portion of the magnetic pole piece 3. When the coil pattern is determined so as to provide the effect, a magnetic field that is directed to the magnetic pole piece surface 9 can be directed away from the magnetic pole piece 3, making it possible to reduce the intensity of electromagnetic interference between the magnetic pole piece surface 9 and a pulse magnetic field generated by the gradient coil 1.

When the abovementioned structure (1) and (2) are used, the intensity of a magnetic field across the magnetic pole piece surface 9 is reduced. Thus, an eddy current and an electromagnetic force applied to the inside of the magnet can be reduced. In addition, those effects lead to reductions in an error magnetic field and in a varying magnetic field. The error magnetic field and the varying magnetic field may obstruct acquisition of a sharp image. As a result, high quality magnetic resonance imaging can be performed.

Specifically, when the structure (1) or (2) is used, a leak magnetic field causing electromagnetic interference with the structural member can be reduced in intensity. More specifically, the generation of an unnecessary magnetic field in an area other than the imaging area 5 can be suppressed. Furthermore, when both of the structure (1) and (2) are used, the generation of an unnecessary magnetic field in an area other than the imaging area 5 can be further suppressed.

First Embodiment

A first embodiment to which the gradient coil according to the present invention is applied will be described below with reference to FIGS. 1, 5, 6, 9, and 10. First, an MRI apparatus will be outlined. The MRI apparatus uses nuclear magnetic resonance to obtain an image representing physical and chemical properties of a subject to be inspected. The nuclear magnetic resonance is generated when the subject placed in a space (imaging area 5) in which a static magnetic field is substantially uniform is irradiated with a high frequency pulse. To be more specific, the MRI apparatus uses the property in which a nuclear magnetic resonance signal generated by hydrogen nuclei forming a biological body varies depending on the tissues. An electromagnetic wave emitted by a hydrogen nuclear spin in response to the nuclear magnetic resonance is measured. The measured electromagnetic wave is computed as a signal, thereby making it possible to obtain a cross sectional image of the subject.

Figure 9:
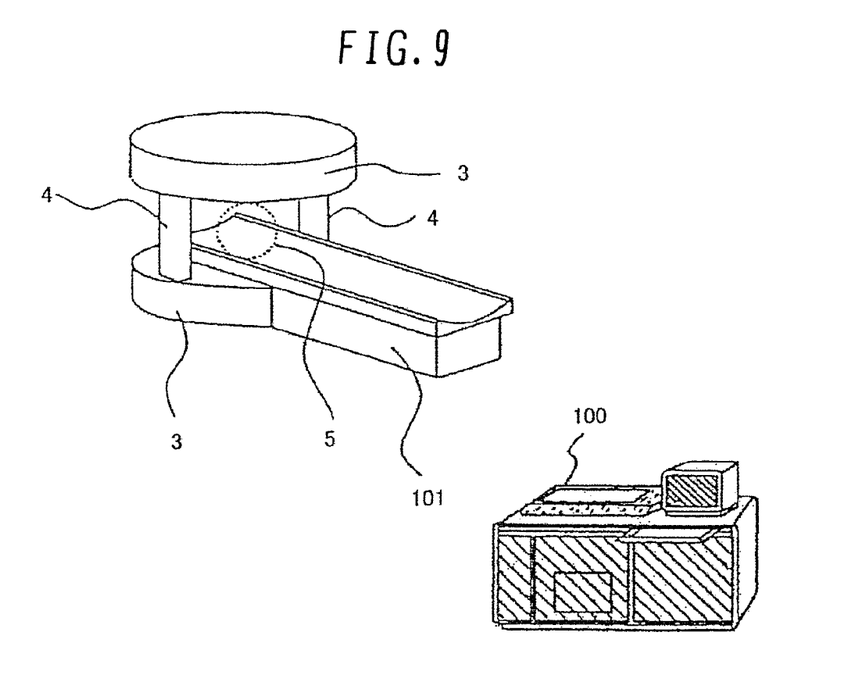
FIG. 9 is a diagram showing the entire configuration of the MRI apparatus using the gradient coils according to the present invention.

FIG. 9 is a diagram showing the entire configuration of the MRI apparatus using the gradient coils according to the present invention. In the present embodiment, a description will be made of a vertical field MRI apparatus that applies a static magnetic field to the imaging area 5 in a vertical direction. As shown in FIG. 9, the MRI apparatus comprises: a pair of magnetic pole pieces 3 that have the imaging area 5 sandwiched therebetween and face each other in a vertical direction; poles 4 for connecting the pair of the magnetic pole pieces 3; a bed 100 for conveying a subject to be inspected to the imaging area 5; and a controller 101 for analyzing a nuclear magnetic resonance signal transmitted from the subject to be inspected. The pair of the magnetic pole pieces 3 are each formed into a substantially cylinder shape.

Hereinafter, in the present invention, a central axis passing through the center of the imaging area 5 in a vertical direction is regarded as Z axis. Axes perpendicular to Z axis are taken as X axis and Y axis in a horizontal direction.

Figure 10:
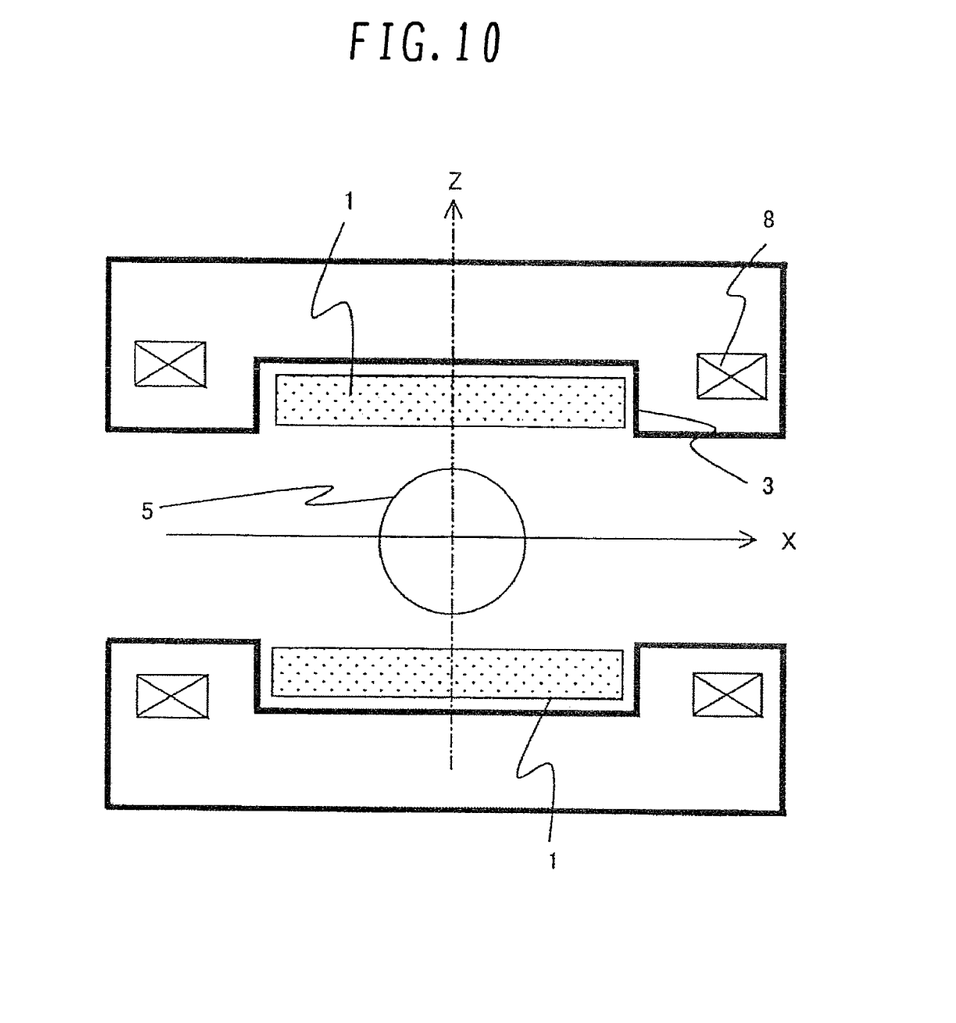
FIG. 10 is a cross sectional view showing a magnet assembly using the gradient coils according to the present invention.

FIG. 10 is a cross sectional view showing a magnet assembly using the gradient coils according to the present invention. The magnet assembly according to the present embodiment comprises: the magnetic pole pieces 3; means 8 for forming a static magnetic field; the gradient coils; and a high frequency coil (not illustrated). The magnetic pole pieces 3 each have therein the means 8 for forming a static magnetic field that is substantially uniform and flows in a direction perpendicular to the imaging area 5. A superconductive coil, a normal conductor coil, permanent magnet, or the like may be used as the means for forming a static magnetic field. According to the present embodiment, a superconductive coil 8 that is annularly formed around Z axis is used.

A substantially cylinder-shaped recessed portion is formed in each of the magnetic pole pieces 3 on the side of the imaging area 5. The gradient coil 1 is placed in each of the recessed portions. With the gradient coils 1, a gradient magnetic field, which is used to encode information on a spatial location into a nuclear magnetic resonance signal, overlaps a static magnetic field so as to be applied.

Each of the gradient coils 1 comprises: an X axis gradient magnetic field coil that generates a magnetic field in X axis direction; and a Y axis gradient magnetic field coil that generates a magnetic field in Y axis direction. The shape of the X axis gradient magnetic field coil is substantially the same as that of the Y axis gradient magnetic field coil. The Y axis gradient magnetic field coil rotates the X axis gradient magnetic field coil by 90 degrees about Z axis. In addition, each of the gradient coils 3 includes: a primary gradient coil 20 that generates a gradient magnetic field; and a shielded gradient coil 21 that generates a magnetic field that cancels (shields) a magnetic field generated by the primary magnetic field 21 on the side opposite to the imaging area 5.

In addition, high frequency coils (not illustrated) are each provided on the side of the imaging area 5 relative to the gradient coils 1. The high frequency coils sandwich the imaging area 5 and face each other in the vertical direction. The high frequency coils irradiate a portion (to be imaged) of a subject to be inspected with a high frequency electromagnetic wave that excites nuclear magnetic resonance.

In such an MRI apparatus, tomography is performed on a subject to be inspected when the subject lying on a bed passes through the imaging area 5. It should be noted that the magnetic pole pieces 3, the superconductive coils 8, the gradient coils 1, and the high frequency coils are arranged on the same axis relative to Z axis.

Figure 1:
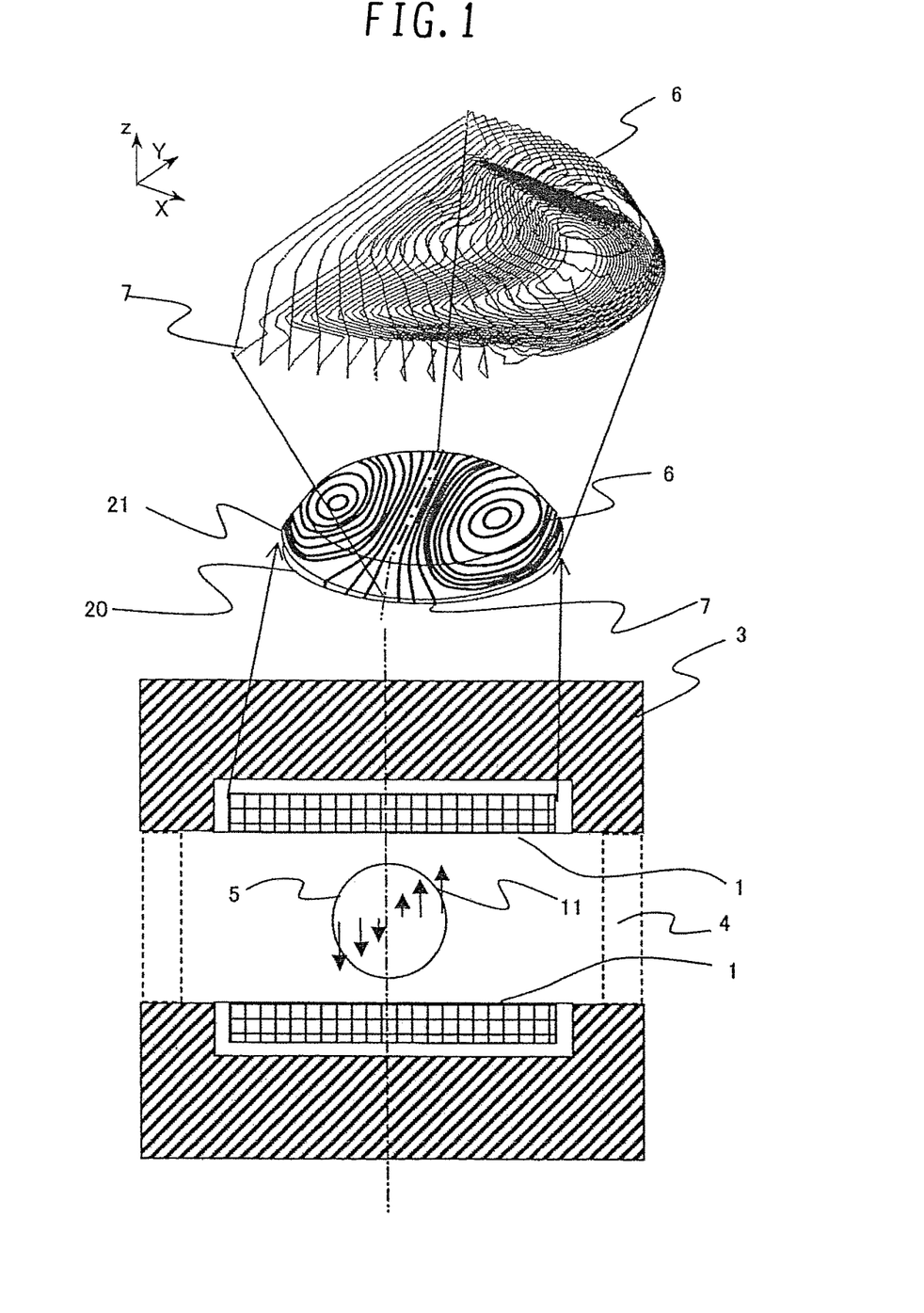
FIG. 1 is a diagram showing a coil pattern of a gradient coil for a magnetic resonance imaging apparatus according to the present invention and a distribution of a magnetic field in an imaging area, the magnetic field being generated by the gradient coil.

The gradient coils according to the present embodiment will be described in detail below. FIG. 1 is a diagram showing a coil pattern of the gradient coils for the MRI apparatus according to the present invention and a distribution of a magnetic field generated by the gradient coils in the imaging area. In FIG. 1, the X axis gradient magnetic field coils are shown. It should be noted that the Y axis gradient magnetic field coils provide a similar coil pattern and a similar distribution of a magnetic field. A drawing shown in the lowest part of FIG. 1 is a cross sectional view showing a magnet of an open type MRI apparatus. The magnetic pole pieces 3 are arranged sandwiching the imaging area 5 and facing each other in the vertical direction. The magnetic pole pieces 3 are connected with each other by using one or more connecting poles 4. The upper magnetic pole piece 3 is supported by the lower magnetic pole piece 3 through the one or more connecting poles 4. The internal structure of each of the magnetic pole pieces 3 varies depending on the magnet type such as a superconductive coil, normal conductor coil, and permanent magnet. For the external structure, the upper and lower magnetic pole pieces 3 are provided. The imaging area 5 is formed by applying a static magnetic field between the upper and lower magnetic pole pieces 3. The gradient coils are arranged sandwiching the imaging area 5 and facing each other in the vertical direction. The arrangement of the magnetic pole pieces 3 and the gradient coils 1 is the same as the conventional one shown in FIG. 2. The gradient coils 1 are arranged in recessed portions of the magnetic pole pieces 3 in many cases in order to make large the imaging area 5 and a space for a subject to be inspected, the space being placed at the periphery of the imaging area 5. Similarly, in the MRI apparatus using the gradient coils according to the present invention, as shown in FIG. 1, the gradient coils 1 are arranged in the recessed portions of the magnetic pole pieces 3, the recessed portions being formed on the side of the imaging area 5. It is a main object of the present invention is to reduce the intensity of a magnetic field that is directed to upper and lower walls on the outer side of the shielded gradient coil, that is, to reduce the generation of an unnecessary magnetic field in an area other than an imaging area.

A drawing shown in the middle part of FIG. 1 shows one gradient coil (i.e., a half of the gradient coils) that has been taken out from the magnet arrangement and shows flows of currents in the conductors. A drawing shown in the top part of FIG. 1 schematically shows central lines of a quarter of the entire conductors (corresponding to a half of one gradient coil). The drawings shown in the top and middle parts of FIG. 1 each show the X axis gradient magnetic field coil which is the upper gradient coil. It should be noted that although FIG. 1 shows the X axis gradient magnetic field coil, the Y axis gradient magnetic field coil provides a similar effect. Although each of the gradient coils has a disk-like shape, the conductors are arranged into a shape of circular truncated cone except base. The outer circumference portion of the shielded gradient coil 21 is closer to the primary gradient coil 20 compared with the other portions of the shielded gradient coil 21. The primary gradient coil 20 is slightly smaller in diameter than the shielded gradient coil 21, and they are configured so that the primary gradient coil 20 is placed in the shielded gradient coil 21 that is formed into a bowl shape. The shielded gradient coil 21, which is formed into an umbrella shape or bowl shape, overlaps and covers the primary gradient coil 20. Since the primary gradient coil 20 is placed in the shielded gradient coil 21, the primary gradient coil 20 is slightly smaller in diameter than the shielded gradient coil 21. This is one of the features of the present invention.

The outermost portion of the shielded gradient coil 21 is preferably close to the intermediate surface of the magnetic pole pieces 3, the intermediate surface being the center of the imaging area 5. An impact on the magnetic pole piece surfaces 9 and the magnetic pole pieces 3 depends on the position of the outermost portion of the shielded gradient coil 21. For the impact, it is preferable that the primary gradient coil 20 be placed in the bowl-shaped shielded gradient coil 21 having a depth set to the maximum possible value. This arrangement is effective in the present invention.

In FIG. 1, conductor lines are wound between the shielded gradient coil 21 and the primary gradient coil 20. The X axis gradient magnetic field coil has a solenoid coil portion with an axis in the X direction. Similarly, the Y axis gradient magnetic field coil has a solenoid coil portion with an axis in the Y direction.

FIGS. 5B and 5C each show an arrangement of coil turns. It should be noted that the coil winding pattern shown in FIG. 1 is schematically shown and that a crossover between coil turns is not shown. In the other drawings, a crossover between coil turns is also not shown.

Such a coil can provide the capability for shielding a magnetic field as shown in FIGS. 5A to 5C according to the present invention and provide a capability for imaging with high quality.

Figure 8:
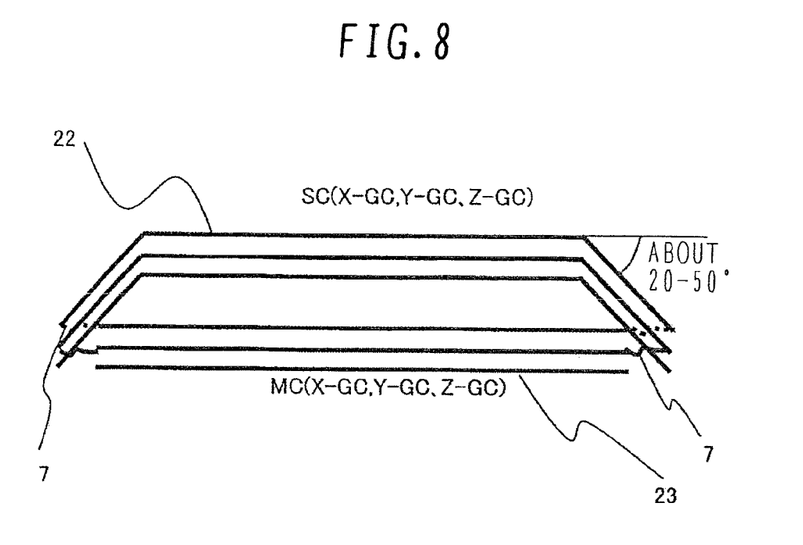
FIG. 8 is a diagram showing the state in which gradient coils according to a first embodiment of the present invention are arranged to be combined with each other.

As described above, the gradient coil 1 includes the X axis gradient magnetic field coil, the Y axis gradient magnetic field coil, and the Z axis gradient magnetic field coil for the three dimensional directions of the gradients. For each of the X, Y, Z axis gradient magnetic field coils, a primary gradient coil group 22 and a shielded gradient coil group 23 are provided. Thus, the gradient coil 1 has a total of six coils incorporated therein. When a combination of conventional flat type coils is used, coil surfaces can overlap each other. However, in the case where the outer circumference of the shielded gradient coil is close to (bent toward) the primary gradient coil, when the bending angle is not large, the shielded gradient coil and the primary gradient coil can overlap each other. FIG. 8 is a diagram showing the case where the gradient coils according to the present invention are arranged to be combined. As shown in FIG. 8, when the bending angle relative to the horizontal plane (X-Y plane) is equal to or smaller than 50 degrees, the gradient coils can be three-dimensionally configured. If the bending angle is too small, a gap between the primary gradient coil and the shielded gradient coil is small at the outer circumference (i.e., on the outer side of the central point of the spiral pattern of the primary gradient coil), which increase the inductance. Therefore, the bending angle is preferably 40 degrees, and the reference value of the bending angle can be set to 20 to 50 degrees.

In the gradient coil according to the present embodiment, a connection is provided between a part of turns of the shielded gradient coil 21 and a part of turns of the primary gradient coil 20 (a coil pattern in which a connection is provided between the shielded gradient coil 21 and the primary gradient coil 20) to reduce the generation of an unnecessary magnetic field in an area other than the imaging area. In addition, the outer circumference of the shielded gradient coil 21 is inclined toward the imaging area to further reduce the generation of an unnecessary magnetic field. Thus, even when the gradient coils 1 are arranged in the recessed portions (formed on the side of the imaging area 5) of the magnetic pole pieces 3, the MRI apparatus capable of performing imaging with high quality can be provided. The gradient coil according to the present embodiment makes it possible to reduce: a magnetic field generated by an eddy current that is generated on the magnetic pole piece surface due to a gradient magnetic field; an oscillating field generated by a gradient magnetic field that serves as an oscillation source and oscillates a magnetomotive force source and a structural member placed around the magnetomotive force source; and an oscillating field generated by an eddy current that induces oscillation. Accordingly, the MRI apparatus can be provided with a capability for performing imaging with high quality and with a reduction in a dynamic error magnetic field, which may reduce the quality of the imaging.

The gradient coil according to the present invention has: a first structure in which a connection is provided between a part of turns of the shielded gradient coil 21 and a part of turns of the primary gradient coil 20; and a second structure in which the outer circumference of the shielded gradient coil 21 is inclined toward the imaging area. When either the first or second structure is used, the generation of an unnecessary magnetic field can be further reduced.

Second Embodiment

Figure 6:
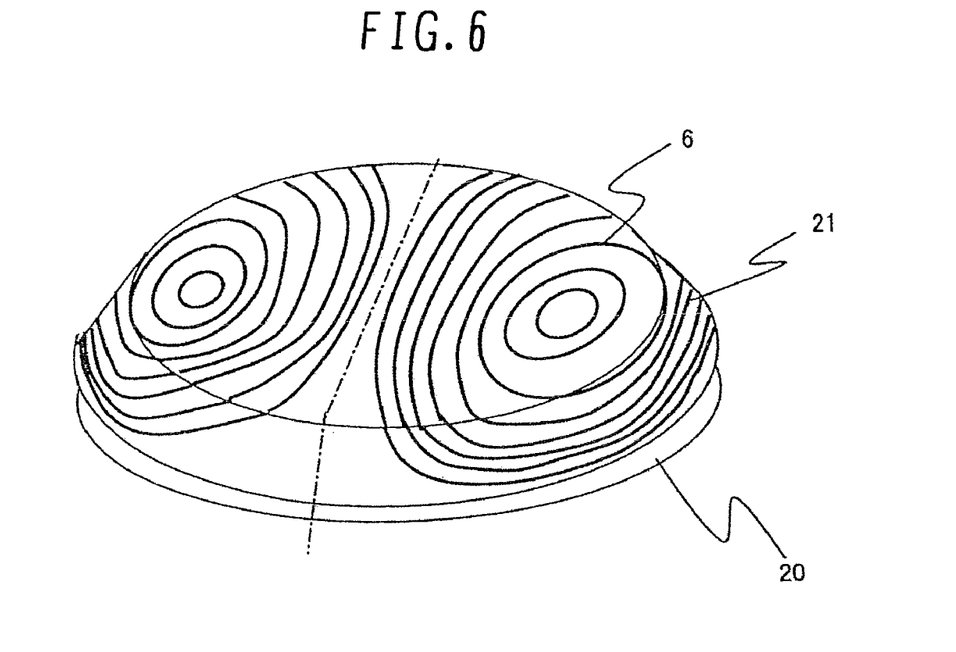
FIG. 6 is a diagram showing the shape of a gradient coil according to a second embodiment of the present invention.

A description will be made of a second embodiment to which the gradient coil according to the present invention is applied with reference to FIG. 6. Since basic configurations of a gradient coil and an MRI apparatus according to the second embodiment are the same as those according to the first embodiment, a detailed description thereof is not provided. The shape of the gradient coil according to the second embodiment is different from that according to the first embodiment. FIG. 6 is a diagram showing the gradient coil according to the second embodiment. The gradient coil according to the second embodiment does not form a solenoidal coil in which conductor lines are wound between the shielded gradient coil 21 and the primary gradient coil 20. The gradient coil 1 having such a configuration is also capable of changing the direction of a magnetic line of force that is directed to the structural member (magnetic pole piece surface 9) located on the outside of the outer circumference of the gradient coil 1. Thus, gradient coil 1 can reduce the intensity of a magnetic field that interferes with the structural member.

Similarly to the first embodiment, in the gradient coil according to the second embodiment, the outer circumference of the shielded gradient coil 21 is inclined toward the imaging area to reduce the generation of an unnecessary magnetic field in an area other than the imaging area 5. Thus, even when the gradient coils 1 are arranged in recessed portions (formed on the side of the imaging area 5) of the magnetic pole pieces 3, the MRI apparatus capable of performing imaging with high quality can be provided. The gradient coil according to the present embodiment makes it possible to reduce: a magnetic field generated by an eddy current that is generated on the magnetic pole piece surface due to a gradient magnetic field; an oscillating field generated by a gradient magnetic field that serves as an oscillation source and oscillates a magnetomotive force source and a structural member placed around the magnetomotive force source; and an oscillating field generated by an eddy current that induces oscillation. Accordingly, the MRI apparatus can be provided with a capability for performing imaging with high quality and with a reduction in a dynamic error magnetic field, which may reduce the quality of the imaging.

Third Embodiment

A description will be made of a third embodiment to which the gradient coil according to the present invention is applied. Since basic configurations of a gradient coil and an MRI apparatus according to the third embodiment are the same as those according to the first embodiment, a detailed description thereof is not provided. The gradient coil 1 according to the third embodiment is different from that according to the first embodiment in that the outer circumference of the shielded gradient coil 21 is not inclined toward the imaging area.

Figure 7:
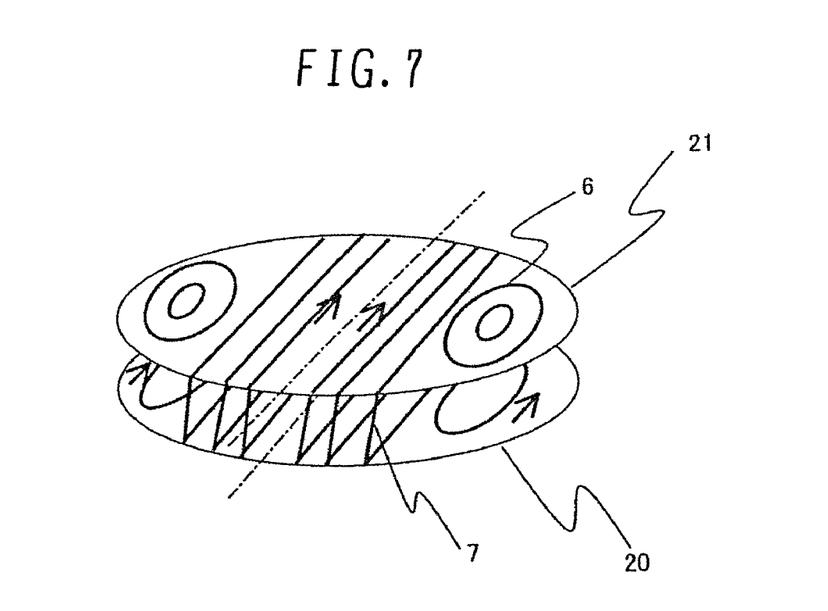
FIG. 7 is a diagram showing a winding structure in which a primary gradient coil and a shielded gradient coil are connected with each other according to a third embodiment of the present invention.

FIG. 7 is a diagram showing a winding structure, according to the present embodiment, in which the primary gradient coil 20 and the shielded gradient coil 21 are connected with each other. Specifically, FIG. 7 shows a detailed structure shown in FIG. 5B. Similarly to FIG. 1, a crossover between turns of conductive windings 6 is not illustrated. The gradient coil having the structure shown in FIG. 7 is also capable of reducing electromagnetic interference with a structural member so as to reduce a magnetic flux flowing to the outer circumference of the gradient coil.

In the gradient coil according to the present embodiment, a connection is provided between a part of turns of the shielded gradient coil 21 and a part of turns of the primary gradient coil 20 to reduce the generation of an unnecessary magnetic field in an area other than the imaging area 5. Thus, even when the gradient coils 1 are arranged in the recessed portions (formed on the side of the imaging area 5) of the magnetic pole pieces 3, the MRI apparatus capable of performing imaging with high quality can be provided. The gradient coil according to the present embodiment makes it possible to reduce: a magnetic field generated by an eddy current that is generated on the magnetic pole piece surface due to a gradient magnetic field; an oscillating field generated by a gradient magnetic field that serves as an oscillation source and oscillates a magnetomotive force source and a structural member placed around the magnetomotive force source; and an oscillating field generated by an eddy current that induces oscillation. Accordingly, the MRI apparatus can be provided with a capability for performing imaging with high quality and with a reduction in a dynamic error magnetic field, which may reduce the quality of the imaging.

It should be noted that, in each of the abovementioned embodiments, the gradient coil 1 according to the present invention is applied to a vertical magnetic field type MRI apparatus. The gradient coil 1 according to the present invention may be applied to not only the vertical magnetic field type MRI apparatus but also a horizontal magnetic field type MRI apparatus which applies a static magnetic field to the imaging area 5 in a horizontal direction.

What is claimed is:

1. A gradient coil that is used for an open type magnetic resonance imaging apparatus and adapted to encode information on the spatial position of a subject into a nuclear magnetic resonance signal, the gradient coil comprising:
    a primary gradient coil that generates a gradient magnetic field in an imaging area; and
    a shielded gradient coil that is placed on the side opposite to the imaging area relative to the primary gradient coil and cancels the gradient magnetic field that has been generated by the primary gradient coil;
    wherein the shielded gradient coil has a first area that includes a central axis perpendicularly extending through a central portion of the imaging area and a second area that is located at an outer periphery of the first area, the second area being bent to the side of the imaging area at an angle larger than the first area, the shielded gradient coil having a plurality of annular conductors that are spirally arranged, the plurality of annular conductors being arranged so that a number of the annular conductors that are each partially located in the second area is larger than a number of the annular conductors that are located only in the first area.

2. A gradient coil according to claim 1, wherein said second area is more inclined to the side of the imaging area than said first area.

3. The gradient coil according to claim 2,
    wherein the plurality of annular conductors are arranged so that the number of the annular conductors that are partially located on the outer side of the second area is larger than the annular conductors that are partially located on the inner side of the second area.

4. The gradient coil according to claim 1,
    wherein the plurality of annular conductors are arranged so that the number of the annular conductors that are partially located in the second area increases as the distance from the center of the shielded gradient coil increases.

5. The gradient coil according to claim 1,
    wherein the radius of the primary gradient coil is smaller than the radius of the shielded gradient coil.

6. The gradient coil according to claim 1,
    wherein the gradient coils are arranged to sandwich the imaging area and face each other in a vertical direction.

7. The gradient coil according to claim 1,
    wherein an angle of the second area inclined to the first area, an angle of the second area bent to the first area, or an angle of the side surface inclined to the top surface, is 20 to 50 degrees relative to a horizontal plane.

8. The gradient coil according to claim 1,
    wherein a wire line is wound a plurality of times between the primary gradient coil and the shielded gradient coil.

9. A magnetic resonance imaging apparatus comprising:
    a gradient coil according to claim 1;
    means for forming a static magnetic field in an imaging area;
    a magnetic pole piece including the means for forming a static magnetic field; and
    a high frequency coil that generates a high frequency electromagnetic wave exciting nuclear magnetic resonance.

10. The magnetic resonance imaging apparatus according to claim 9,
    wherein the gradient coil is arranged in a recessed portion of the magnetic pole piece, the recessed portion being formed on the side of the imaging area.

11. The magnetic resonance imaging apparatus according to claim 9,
    wherein the means for forming a static magnetic field, the magnetic pole piece, the gradient coil, and the high frequency coil are arranged on the same axis.

12. A gradient coil that is used for an open type magnetic resonance imaging apparatus and adapted to encode information on the spatial position of a subject into a nuclear magnetic resonance signal, the gradient coil comprising:
    a primary gradient coil that generates a gradient magnetic field in an imaging area; and
    a shielded gradient coil that is placed on the side opposite to the imaging area relative to the primary gradient coil and cancels the gradient magnetic field that has been generated by the primary gradient coil,
    wherein the gradient coil is formed into a substantially conical shape;
    wherein the primary gradient coil forms a bottom surface of the substantially conical shape; and
    wherein the shielded gradient coil forms a side surface and a top surface of the substantially conical shape;
    wherein the shielded gradient coil has a plurality of annular conductors that are spirally arranged; and
    wherein the plurality of annular conductors are arranged so that a number of the annular conductors that are partially located on the side surface is larger than a number of the annular conductors that are located only on the top surface.

13. The gradient coil according to claim 12,
    wherein the plurality of annular conductors are arranged so that the number of the annular conductors that are partially located on the outer side of the side surface is larger than the number of the annular conductors that are partially located on the inner side of the side surface.

14. The gradient coil according to claim 12,
    wherein the plurality of annular conductors are arranged so that the number of the annular conductors that are partially located on the side surface increases as the distance from the center of the shielded gradient coil increases.

* * * * *